United States Patent
Ma et al.

(10) Patent No.: US 6,573,134 B2
(45) Date of Patent: Jun. 3, 2003

(54) DUAL METAL GATE CMOS DEVICES AND METHOD FOR MAKING THE SAME

(75) Inventors: Yanjun Ma, Vancouver, WA (US); Yoshi Ono, Camas, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/817,834

(22) Filed: Mar. 27, 2001

(65) Prior Publication Data

US 2002/0140036 A1 Oct. 3, 2002

(51) Int. Cl.[7] .......................... H01L 21/8238
(52) U.S. Cl. .................. 438/216; 438/229; 438/299
(58) Field of Search ................. 438/216, 229, 438/299, 300

(56) References Cited

U.S. PATENT DOCUMENTS 6,291,282 B1 * 9/2001 Wilk et al. ............... 438/203
6,303,418 B1 * 10/2001 Cha et al. ................. 438/199
6,365,450 B1 * 4/2002 Kim .......................... 438/216
6,406,956 B1 * 6/2002 Tsai et al. ................. 438/201
6,410,376 B1 * 6/2002 Ng et al. ................... 438/199
6,444,512 B1 * 9/2002 Madhukar et al. ......... 438/203

* cited by examiner

*Primary Examiner*—Richard Elms
*Assistant Examiner*—Christian D. Wilson
(74) *Attorney, Agent, or Firm*—David C. Ripma; Matthew D. Rabdau; Scott C. Krieger

(57) ABSTRACT

A method of fabricating a dual metal gate CMOS includes forming a gate oxide in a gate region and depositing a place-holder gate in each of a n-well and p-well; removing the place-holder gate and gate oxide; depositing a high-k dielectric in the gate region; depositing a first metal in the gate region of the p-well; depositing a second metal in the gate region of each of the n-well and p-well; and insulating and metallizing the structure. A dual metal gate CMOS of the invention includes PMOS transistor and a NMOS transistor. In the NMOS, a gate includes a high-k cup, a first metal cup formed in the high-k cup, and a second metal gate formed in the first metal cup. In the PMOS, a gate includes a high-k cup and a second metal gate formed in the high-k cup.

15 Claims, 3 Drawing Sheets

DUAL METAL GATE CMOS DEVICES AND METHOD FOR MAKING THE SAME

FIELD OF THE INVENTION

This invention relates to MOS transistors and IC fabrication method, and specifically to a dual metal gate CMOS device and the fabrication thereof.

BACKGROUND OF THE INVENTION

Dual metal gate CMOS devices are suggested in the 1999 edition of *International Technology Roadmap for Semiconductors,* however, that publication neither teaches nor suggests any process for making such devices, nor does it specify materials or parameters for making dual metal gate CMOS devices.

Current CMOS devices use polysilicon as the gate electrode for both the NMOS and the PMOS transistor, wherein N+ polysilicon is used for the NMOS transistor, while P+ polysilicon is used for the PMOS. Because of gate depletion problems associated with polysilicon, replacing the polysilicon with metal is expected to provide a more reliable and efficient CMOS device.

There are currently two techniques for placement of metal electrodes in IC devices: one is to use a metal electrode with the Fermi level at the middle of the Si band gap. The second technique is to use dual metal: one metal functions similarly to that of N+ polysilicon in the NMOS transistor, and a second, different metal functions similarly to P+ polysilicon in the PMOS transistor.

SUMMARY OF THE INVENTION

A method of fabricating a dual metal gate CMOS, includes preparing a silicon substrate to form device areas, wherein each device area includes an n-well and a p-well; forming a gate oxide in a gate region and depositing a place-holder gate in each of the n-well and p-well; implanting ions to form a source region and a drain region in each of the n-well and p-well; removing the place-holder gate and gate oxide; depositing a high-k dielectric in the gate region; depositing a first metal in the gate region of the p-well; depositing a second metal in the gate region of each of the n-well and p-well; and insulating and metallizing the structure.

A dual metal gate CMOS of the invention includes a substrate having an n-well to form a PMOS transistor and a p-well to form a NMOS transistor, each having a gate region, a source region and a drain region; in the NMOS, a gate including a high-k cup, a first metal cup formed in the high-k cup, and a second metal gate formed in the first metal cup; in the PMOS, a gate including a high-k cup and a second metal gate formed in the high-k cup; wherein the first metal is taken from the group of metals consisting of platinum and iridium; and wherein the second metal is taken from the group of metals consisting of aluminum, zirconium, molybdenum, niobium, thallium, thallium nitride and vanadium.

It is an object of the invention to provide an efficient, reliable dual metal gate CMOS device.

Another object of the invention is to provide a CMOS device wherein polysilicon is not used in the gate region.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
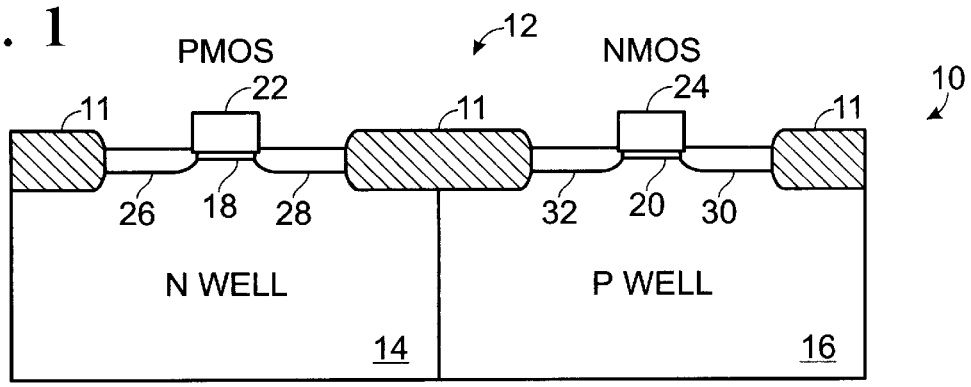
FIGS. 1–7 depict steps in the formation of a dual metal gate CMOS device according to the method of the invention.

This invention provides a process for integration of dual metal gate CMOS devices, and a CMOS device constructed according to the method of the invention. Turning now to FIG. 1, the CMOS device of the invention is formed on a wafer 10 of p-type silicon. Wafer 10 is segmented to provide device isolation by oxide regions 11 and form device areas, one of which is shown generally at 12. State-of-the-art process are followed to form an n-well 14 for the PMOS transistor, and a p-well 16 for the NMOS transistor. These areas may be formed by, for the PMOS, by implantation of phosphorus ions, at a dose of about $5-10^{13}$ cm$^{-2}$ to $5-10^{14}$ cm$^{-2}$, and at an energy level of 50 keV to 200 keV, and for the NMOS, by implantation of boron ions, at a dose of about $5-10^{13}$ cm$^{-2}$ to $5-10^{14}$ cm$^{-2}$, and at an energy level of 20 keV to 100 keV. The threshold voltage is adjusted. A gate oxide layer 18, 20, for the PMOS transistor and the NMOS transistor, respectively, is formed by thermal oxidation. Silicon nitride ($Si_3N_4$), or polysilicon, in a thickness of between about 150 nm to 500 nm is deposited by plasma-enhanced chemical vapor deposition (PECVD), to form what is referred to as a "dummy" gate, or a place-holder gate. Place-holder gates 22, 24 are formed in the PMOS and NMOS, respectively these are formed by photolithography and anisotropic plasma etching of the nitride, or polysilicon, with the etching stopping at the level of the gate oxide. The gate oxide may be partially etched or may be completely removed during this etch process. The nitride layer forms a replacement cast for the gate electrode.

Source and drain junctions are formed in both the PMOS and NMOS. One technique for accomplishing this is to by implantation of $BF_2$ ions, at a dose of about $1-10^{15}$ cm$^{-2}$ to $5-10^{15}$ cm$^{-2}$, and at an energy level of 30 keV to 50 keV, in n-well 14, to provide a source 26 and a drain 28 for the PMOS, and to implant arsenic ions, at a dose of about $1-10^{15}$ cm$^{-2}$ to $5-10^{15}$ cm$^{-2}$ and at an energy level of 30 keV to 60 keV, in p-well 16, to provide a source 30 and a drain 32 for the NMOS. An oxide spacer is formed by depositing oxide and anisotropic etching, followed by silicide deposition.

Figure 2:
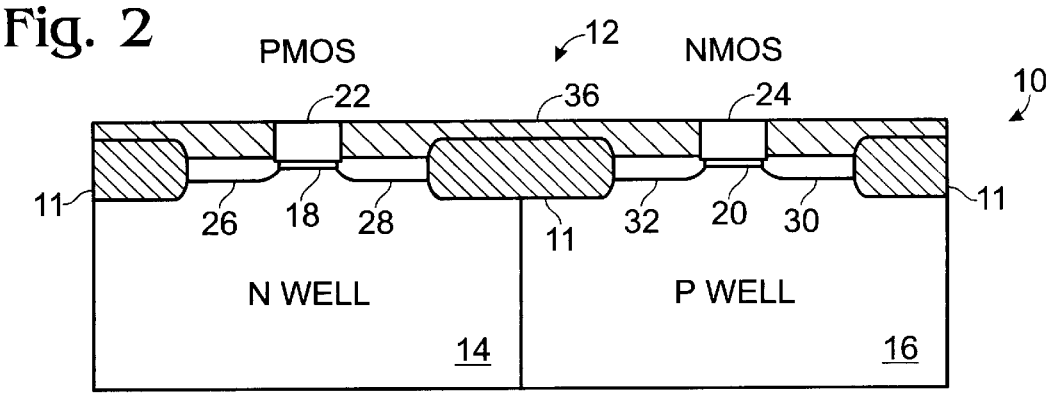

Referring now to FIG. 2, an oxide layer 36 is deposited by CVD. The desired thickness is about 1.5× to 2× the thickness of the silicon nitride layer deposited in FIG. 1. The structure is planarize by a CMP process, stopping at the top of the silicon nitride. A high selectivity slurry is desirable for the CMP process.

Figure 3:
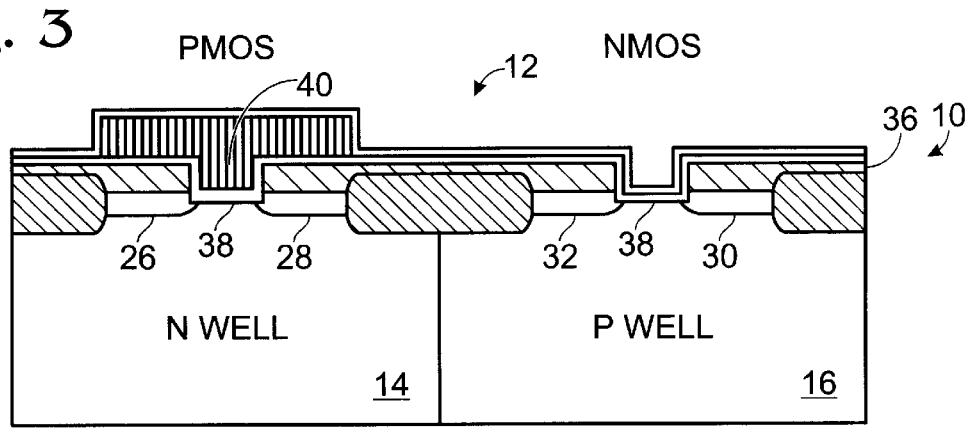
Figure 4:
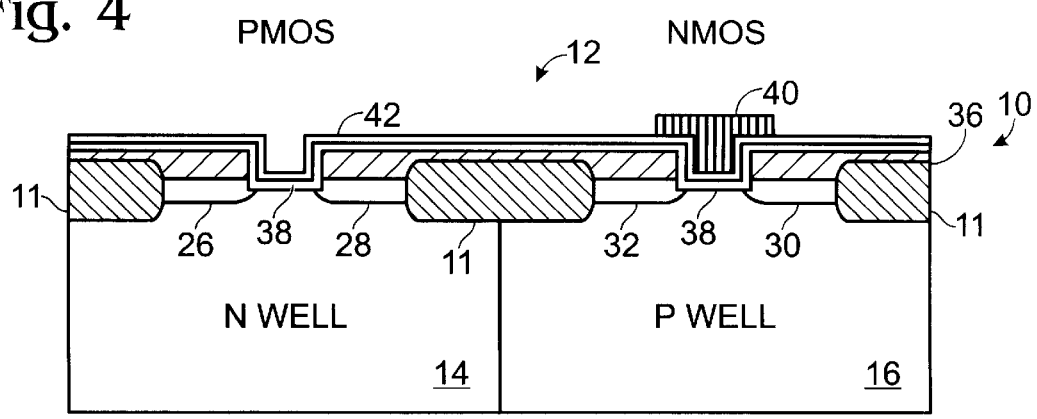

Turning now to FIGS. 3 and 4, removal of the nitride place-holder gates 22, 24 and gate oxides 18, 20. A high-k gate dielectric 38, such as $HfO_2$ or $ZrO_2$, is deposited to a thickness of between about 3 nm to 8 nm, and treated by conventional post deposition treatment, including annealing, at a temperature in a range of about 500° C. to 800° C. for between about 10 minutes to 60 minutes, forming a dielectric cup in the gate region of each of n-well 14 and p-well 16. The next step of the method of the invention may be performed in either of two way.

The first option, and now referring to FIG. 3, is to apply photoresist 40 to pattern the gate area of the NMOS, and to deposit, by sputtering, the first metal 42 for the metal gate electrode. The first metal is generally either platinum or iridium. The metal is patterned, and the metal etched, except for the metal in the gate are of the NMOS. The photoresist is then removed, resulting at the structure shown in FIG. 5, which includes a first metal cup formed inside the high-k cup in the NMOS.

Figure 5:
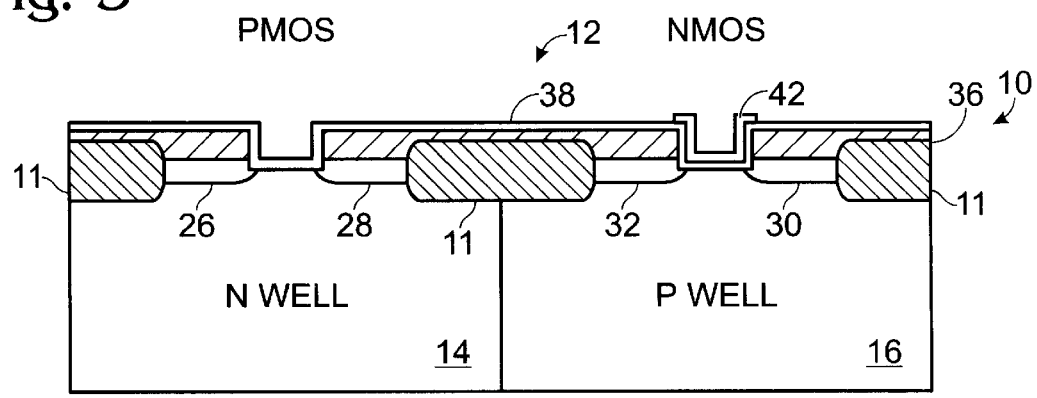

The second option, and now referring to FIG. 4, is to deposit a first metal 42 over the entire wafer, and then to pattern the wafer and the PMOS area with photoresist 40. The exposed metal is then selectively wet etched with an etchant that will not etch the high-k gate dielectric. One such etchant is $H_2O_2$. The resulting structure, as from the first option, is shown in FIG. 5.

Figure 6:
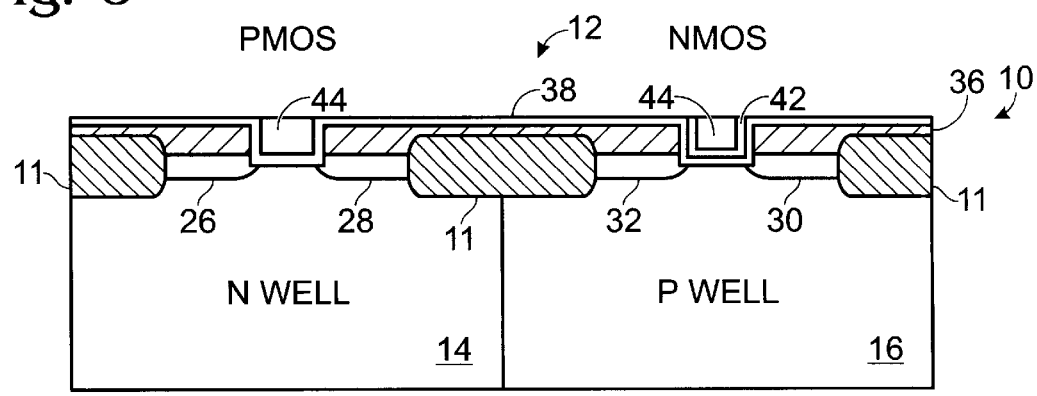

The next step in the method of the invention is to deposit the second metal 44, which may be any metal taken from the group aluminum, zirconium, molybdenum, niobium, thallium, thallium nitride and vanadium. This metal is then smoothed and reduced by CMP, resulting in the structure shown in FIG. 6, wherein a metal gate electrode is formed in the high-k cup of the PMOS and in the first metal cup of the NMOS.

Figure 7:
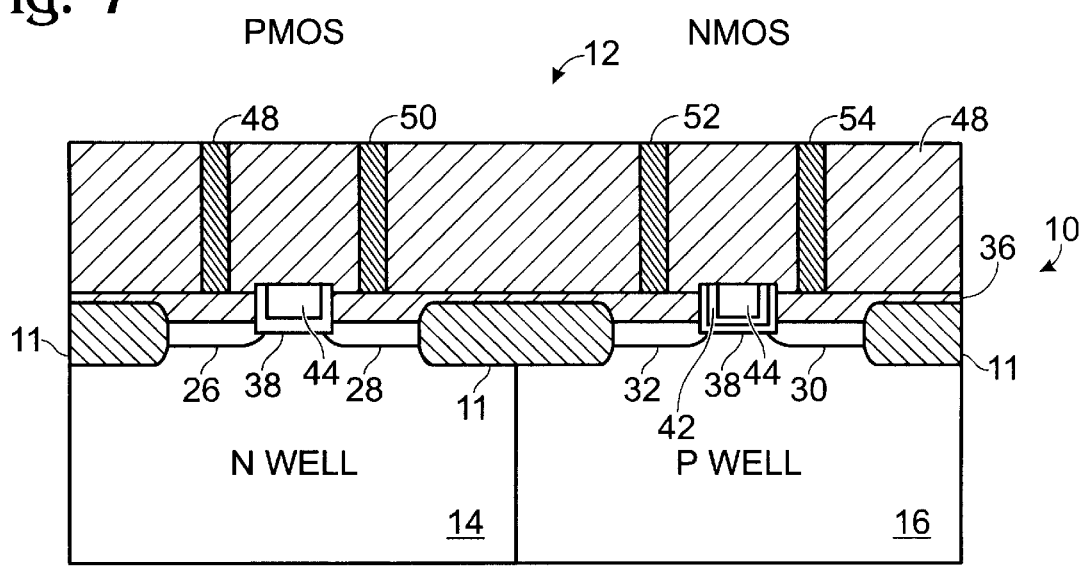

The remainder of the process to complete the dual metal gate CMOS, and now referring to FIG. 7, proceeds according to state-of-the-art processes to remove the remaining high-k material, deposit insulating oxide 46, and medialis the structure, 48, 50, 52 and 54. Medullization for the gate electrodes is also performed, although the structure does not show in the view in FIG. 7.

Thus, a method and system for dual metal gate CMOS devices and method for making the same has been disclosed. It will be appreciated that further variations and modifications thereof may be made within the scope of the invention as defined in the appended claims.

We claim:

1. A method of fabricating a dual metal gate CMOS, comprising:
    preparing a silicon substrate to form device areas, wherein each device area includes an n-well and a p-well;
    forming a gate oxide in a gate region and depositing a place-holder gate in each of the n-well and p-well;
    implanting ions to form a source region and a drain region in each of the n-well and p-well;
    removing the place-holder gate and gate oxide;
    depositing a high-k dielectric in the gate region;
    depositing a first metal in the gate region of the p-well;
    depositing a second metal in the gate region of each of the n-well and p-well; and
    insulating and metallizing the structure.

2. The method of claim 1 wherein said depositing a place-holder gate includes depositing a place-holder material to a thickness of between about 150 nm to 500 nm.

3. The method of claim 2 wherein said depositing a place-holder material includes depositing $Si_3N_4$.

4. The method of claim 2 which further includes depositing an oxide layer before said removing, wherein said oxide layer is between about 1.5× to 2.0× the thickness of the place-holder gate.

5. The method of claim 1 wherein said depositing a high-k material includes depositing a high-k material taken from the group of materials consisting of $HfO_2$ and $ZrO_2$.

6. The method of claim 1 wherein said depositing a high-k material includes depositing high-k material to a thickness of between about 3 nm to 8 nm.

7. The method of claim 1 wherein said depositing a first metal includes patterning the gate area of the p-well and depositing a first metal, patterning the first metal and selectively etching the first metal.

8. The method of claim 1 wherein said depositing a first metal includes depositing a layer of the first metal over the entire device area, and patterning the device area to leave a first metal cup in the gate region of the p-well.

9. The method of claim 1 wherein said depositing a first metal includes depositing a metal taken from the group of metals consisting of platinum and iridium.

10. The method of claim 1 wherein said depositing a second metal includes depositing a metal taken from the group of metals consisting of aluminum, zirconium, molybdenum, niobium, thallium, thallium nitride and vanadium.

11. A method of fabricating a dual metal gate CMOS, comprising:
    preparing a silicon substrate to form device areas, wherein each device area includes an n-well and a p-well;
    forming a gate oxide in a gate region and depositing a place-holder gate in each of the n-well and p-well, including depositing a $Si_3N_4$ place-holder material to a thickness of between about 150 nm to 500 nm;
    implanting ions to form a source region and a drain region in each of the n-well and p-well;
    depositing an oxide layer to a thickness of between about 225 nm to 1000 nm;
    removing the place-holder gate and gate oxide;
    depositing a high-k dielectric in the gate region;
    depositing a first metal taken from the group of metals consisting of platinum and iridium in the gate region of the p-well;
    depositing a second metal taken from the group of metals consisting of aluminum, zirconium, molybdenum, niobium, thallium, thallium nitride and vanadium in the gate region of each of the n-well and p-well; and
    insulating and metallizing the structure.

12. The method of claim 11 wherein said depositing a high-k material includes depositing a high-k material taken from the group of materials consisting of $HfO_2$ and $ZrO_2$.

13. The method of claim 11 wherein said depositing a high-k material includes depositing high-k material to a thickness of between about 3 nm to 8 nm.

14. The method of claim 11 wherein said depositing a first metal includes patterning the gate area of the p-well and depositing a first metal, patterning the first metal and selectively etching the first metal.

15. The method of claim 11 wherein said depositing a first metal includes depositing a layer of the first metal over the entire device area, and patterning the device area to leave a first metal cup in the gate region of the p-well.

* * * * *